United States Patent
Yang et al.

(10) Patent No.: US 8,772,871 B2
(45) Date of Patent: Jul. 8, 2014

(54) PARTIALLY DEPLETED DIELECTRIC RESURF LDMOS

(75) Inventors: Hongning Yang, Chandler, AZ (US); Jiang-Kai Zuo, Chander, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 676 days.

(21) Appl. No.: 12/860,565

(22) Filed: Aug. 20, 2010

(65) Prior Publication Data

US 2012/0043608 A1   Feb. 23, 2012

(51) Int. Cl.
 *H01L 21/02* (2006.01)
 *H01L 23/62* (2006.01)
 *H01L 29/66* (2006.01)

(52) U.S. Cl.
 USPC ............ 257/344; 257/360; 257/408; 257/409

(58) Field of Classification Search
 CPC ............ H01L 29/0653; H01L 29/7835; H01L 29/66659; H01L 29/0847; H01L 29/0692; H01L 29/1083; H01L 29/063; H01L 29/0634
 USPC ......... 257/339, 336, 337, 343, 408, 549, 492, 257/493, E29.261, E29.256, 328, 344, 360, 257/409
 See application file for complete search history.

(56) References Cited

U.S. PATENT DOCUMENTS

| | | | |
|---|---|---|---|
| 5,386,136 A * | 1/1995 | Williams et al. | 257/409 |
| 7,776,700 B2 | 8/2010 | Yang et al. | |
| 2008/0166849 A1* | 7/2008 | Yang et al. | 438/305 |
| 2009/0072319 A1* | 3/2009 | Sonsky et al. | 257/368 |
| 2009/0085101 A1* | 4/2009 | Huang et al. | 257/328 |
| 2009/0294849 A1 | 12/2009 | Min et al. | |
| 2010/0025765 A1 | 2/2010 | Yang et al. | |
| 2010/0156388 A1 | 6/2010 | Yang et al. | |
| 2010/0164056 A1 | 7/2010 | Min et al. | |
| 2011/0241083 A1* | 10/2011 | Khemka et al. | 257/262 |

OTHER PUBLICATIONS

J. Sonsky et al., Dielectric Resurf: Breakdown Voltage Control by STI Layout in Standard CMOS, Electron Devices Meeting, 2005. IEDM Technical Digest. IEEE International, Issue Date: Dec. 2005, pp. 4 pp. 376.

* cited by examiner

*Primary Examiner* — Phat X Cao
*Assistant Examiner* — Diana C Vieira
(74) *Attorney, Agent, or Firm* — Terrile, Cannatti, Chambers & Holland, LLP; Michael Rocco Cannatti

(57) ABSTRACT

An partially depleted Dieler LDMOSFET transistor (100) is provided which includes a substrate (150), a drift region (110) surrounding a drain region (128), a first well region (107) surrounding source region (127), a well buffer region (106) separating the drift region and first well region to at least partly define a first channel region, a gate electrode (118) formed over the first channel region having a source-side gate edge aligned with the first well region (107), an LDD extension region (120) extending from the source region to the channel region, and a dielectric RESURF drain extension structure (161) formed at the drain of the gate electrode (118) using the plurality of STI stripes (114).

20 Claims, 3 Drawing Sheets

PARTIALLY DEPLETED DIELECTRIC RESURF LDMOS

BACKGROUND OF THE INVENTION

1. Field of the Invention

The present invention is directed in general to integrated circuit devices and methods for manufacturing same. In one aspect, the present invention relates to the manufacture and use of laterally diffused MOS transistor (LDMOSFET) devices employing reduced surface field (RESURF) structures.

2. Description of the Related Art

High-voltage integrated circuits applications, such as high-voltage smart power applications, are constructed with integrated circuit MOS field effect transistor devices which must be able to sustain high voltages (e.g., fifty volts or greater) across the transistor device's source, body, gate, and drain terminals. With such high-voltage applications, laterally diffused MOS (LDMOS) transistor devices are often used to provide the high-voltage transistor devices. But such LDMOS devices usually require thick and low-doped epitaxial layer, which makes them difficult to integrate with low-voltage circuitry on the same chip. In addition, there are typically tradeoffs posed when integrating LDMOS devices between the on-resistance and breakdown voltage parameters of such devices, where the on-resistance is ideally kept low and the breakdown voltage is ideally kept high. For example, a design for an LDMOS device which increases the device breakdown voltage typically also increases the on-resistance, which is undesirable. There are additional challenges presented with LDMOS devices, including problems posed by implementing LDMOS designs with existing CMOS fabrication processes. For example, a dielectric RESURF (Dieler) effect has been used with LDMOS devices to create narrow active shallow trench isolation (STI) stripes in the drain area for purposes of increasing the breakdown voltage (BVdss), but with most advanced CMOS technologies, the drift depth for the n-well/p-well region(s) is larger than the STI depth, resulting in partial depletion and much lower breakdown voltages.

Accordingly, a need exists for improved semiconductor devices, especially RESURF type LDMOS devices having improved breakdown voltage without a corresponding degradation of other important device properties. There is also a need for a high-voltage transistor device and fabrication processes to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
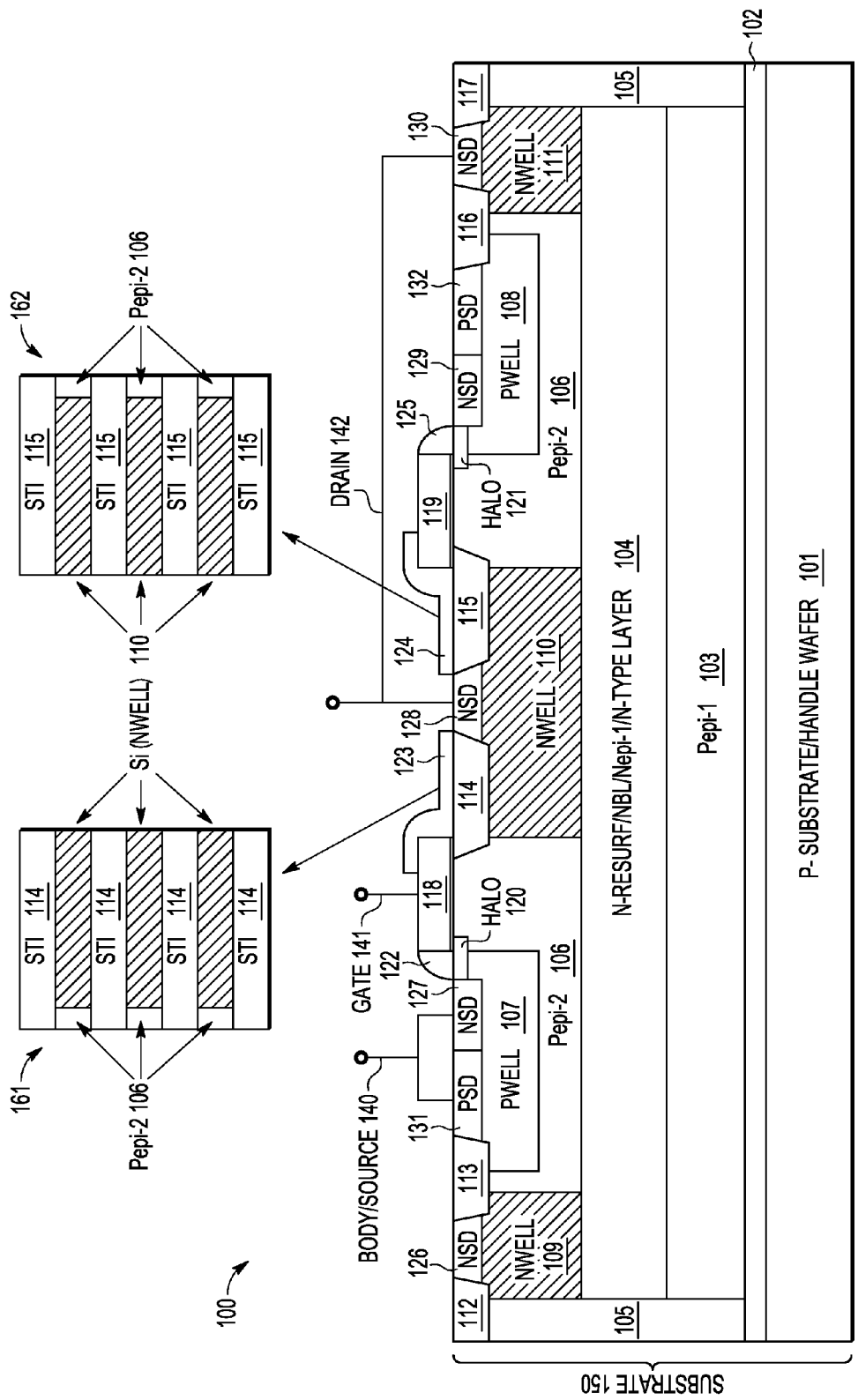
FIG. 1 is a partial cross-sectional view of an LDMOS device having a dielectric RESURF drain extension structure using a lightly doped p-well buffer region and gate halo region in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

An N-Channel laterally diffused MOS (NLDMOS) transistor with a partially depleted dielectric RESURF (Dieler) drain extension structure is described for use with high voltage (e.g., approximately 15V or greater) smart power applications. The disclosed LDMOS transistor includes a dielectric RESURF drain extension structure having a plurality of STI stripes formed in a deeper low voltage n-well drain extension region. With the STI stripes positioned across the n-well and adjacent p-type region under the intended gate area to form narrow p-n diode strips, wider depletion widths and increased breakdown voltages are obtained. To further increase the breakdown voltage between the n-well and p-well regions, the p-well is pulled away from the n-well by disposing the p-well in a lightly doped p-type buffer region (e.g., p-epi buffer layer), thereby partially depleting the n-well drift region. By positioning the p-well within the p-type buffer region to be aligned with the source-side gate edge and providing a source extension or halo region which extends under the gate, the device breakdown voltage is increased and punch-through between source and drain is prevented. In particular, the partially depleted n-well drift region provides better HCI immunity in the surface channel, while the heavily doped n-well region provides better conductivity for reduced series ON-resistance (Rdson). As will be appreciated, existing CMOS technologies can provide the combination of the p-type buffer region and source extension or halo region without requiring high voltage process technologies or their associated process costs and complexities (such as adding high voltage n/p wells, thick gate oxides, additional thermal budgets, etc.). However, selected embodiments of the present invention may also use high voltage fabrication processes to form the partially depleted Dieler drain extension structure by providing a lower doped high voltage n-well region in the drift region adjacent to the n-well region to obtain even higher break down voltage and lower Rdson performance. The fabrication of the Dieler LDMOS with a low voltage n-well (formed as a partially depleted drift region), p-well (formed in alignment with the gate edge and positioned within a very lightly doped p-epi buffer region at the channel/drain junction buffer), STI stripes (formed in the heavily doped n-well drift region and very lightly doped p-epi buffer region), and halo region (formed as a source extension under the gate) provides better HCI immunity, lower Rdson, and increased breakdown voltage.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of an LDMOS device 100 having a dielectric RESURF drain extension structure 110, 114 and 115 formed in the substrate 150 using a lightly doped p-well buffer region 106 and gate halo region 120. Though the various structures, well, and layer regions are illustrated in simplified form with straight lines and corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. The depicted LDMOS structure 100 is formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++). For example, the depicted NLDMOS structure 100 may be formed on or as part of a semiconductor substrate 101 formed of a material having first conductivity type impurities, such as a p-type substrate layer 101, at a predetermined P-doping level (e.g., approximately $1E15$ $cm^{-3}$), though any desired dopant type and/or concentration may be used.

As will be appreciated, the substrate 150 may be formed as a bulk semiconductor substrate or a semiconductor-on-insulator (SOI) type substrate in which one or more additional semiconductor layers and/or well regions are formed using epitaxial semiconductor growth and/or selective doping techniques as described more fully hereinbelow. Thus, the invention is not limited to any specific substrate type. For example, the substrate 150 may be a semiconductor-on-insulator (SOI) type substrate which includes a p-type semiconductor substrate layer 103, buried insulator layer 102, and p-type semiconductor substrate 101. Though not explicitly shown, those skilled in the art will appreciate that such SOI substrates may be formed by bonding a donor wafer to a handle wafer. With this technique, the p-type semiconductor substrate 101 and at least part of the dielectric layer 102 are provided as a handle wafer which is bonded or otherwise attached to a donor wafer which includes part of the dielectric layer 102 and the p-type semiconductor layer 103 which may be formed in whole or in part as a p-type epitaxial layer. Alternatively and depending on the type of transistor being fabricated, the semiconductor substrate 150 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other IIIN or II/VI compound semiconductors or any combination thereof.

In the substrate 150, an isolation structure may be formed which includes an N+ buried layer 104 and one or more n-type sinker wells 109, 111. The n-type sinker well(s) 109, 111 may be formed by using a mask to selectively diffuse or implant n-type impurities into the substrate 150 to a predetermined implant energy and dopant concentration (e.g., $1E16$ to $1E19$ $cm^{-3}$) so as to be located in an upper portion of the substrate 150 and around the subsequently formed N+ contact region(s) 126, 130. As for each N+ buried layer 104, a different mask and implant sequence is used to selectively implant n-type impurities (e.g., Antimony) into the substrate 150 to a predetermined implant energy and dopant concentration (e.g., $1E18$ to $1E20$ $cm^{-3}$) so as to overlap with and extend laterally from the n-type sinker well 109, 111 and below at least part of the subsequently-formed LMOSFET structure. As depicted, the isolation structure 104/111 is shorted to the drain region 128 via one or more drain metallization layers 142 in order to obtain the desired RESURF action and current flow between the source 127 and drain 128 and to provide junction isolation during normal MOSFET operation. As will be appreciated, the N+ buried layer 104 may be a buried layer, RESURF layer, epitaxial layer or any N-type layer formed in any manner. N+ sinker well 109, 111 may be implemented as a conductive sinker or in any desired manner, and in combination with N+ buried layer 104, forms a conductive isolation tub or conductive isolation feature which may be used to conductively isolate the NLDMOS structure 100 from the rest of the integrated circuit. Additional isolation is provided by forming deep trench insulator regions 105 around the active area in the substrate 150 using any desired technique for etching and filling deep trench openings with one or more dielectric materials.

Above the buried layer 104 and in the active area for the NLDMOSFET structure 100, one or more semiconductor layers 106 are formed in the semiconductor substrate 150 to a predetermined depth of a material having the first conductivity type (e.g., p-type) impurities so as to be located in at least the subsequently-formed gate and source region areas. For example, the p-type semiconductor layer(s) 106 (Pepi-2) may be formed with an epitaxial p-type layer 106 having a thickness in the range of approximately 1.5-5 um with a p-type doping concentration (e.g., approximately $1E14$ to $1E16$ $cm^{-3}$, and more preferably $2E15$ $cm^{-3}$), though other dopant types, thicknesses, and/or concentrations may be used. However formed, the doping concentration and/or epitaxial growth conditions are selected and controlled to form the p-type semiconductor layers 106 under the source and gate areas as a lightly doped p-well buffer region for the subsequently-formed p-well source containment region 107. At this stage of the process, the epitaxial p-type layer 106 may be formed over the entirety of the N+ buried layer 104 using any desired epitaxial process for growing or depositing a p-type semiconductor layer to the desired thickness and doping concentration. At a minimum, the p-type semiconductor layers 106 are formed in the substrate 150 to surround the areas under the intended gate electrode(s) 118, 119 and source region(s) 127, 129.

In the p-type semiconductor layer 106, one or more first low voltage well regions 107, 108 are formed to a predetermined depth of a material having the first conductivity type (e.g., p-type) impurities so as to be located to surround and contain each subsequently-formed source region 127, 129. For example, the low voltage p-well regions 107, 108 may be formed by using a mask or other technique to selectively diffuse or implant p-type impurities using a predetermined implant energy and dopant concentration (e.g., 1E16 to 1E19 $cm^{-3}$, and more preferably 5E16 to 5E18 $cm^{-3}$), though other dopant types, thicknesses, and/or concentrations may be used. However formed, the doping concentration, implant energy, and junction depth are selected and controlled to form the p-well regions 107, 108 so that they are completely contained within the lightly doped p-well buffer region 106 so as to be pulled back from the edge of the buffer region 106. In addition, the formation and placement of the p-well regions 107, 108 (including any subsequent heat treatment steps) is controlled so that each gate-side edge of the p-well regions 107, 108 is substantially aligned with the edge of the subsequently-formed gate electrode 118, 119 (e.g., to within 10-20% of the width of the gate). By pulling the edge of the more heavily doped p-well regions 107, 108 back from the edge of the lightly doped p-type layer 106, the device breakdown voltage is increased as compared to the situation where the n-well 110 and p-well regions 107, 108 are positioned adjacent to one another.

In addition, one or more second low voltage well regions 109-111 are formed to a predetermined depth of a material having the second conductivity type (e.g., n-type) impurities so as to be located to surround and contain at least the subsequently-formed drain region(s) 128. For example, the low voltage n-well regions 110 may be formed by using a mask or other technique to selectively diffuse or implant n-type impurities into the substrate 150 to a predetermined thickness (e.g., about 0.2 to 3 microns) using a predetermined implant energy and dopant concentration (e.g., 5E14 to 2E18 $cm^{-3}$, and more preferably 5E16 to 5E17 $cm^{-3}$), though other dopant types, thicknesses, and/or concentrations may be used. It will be appreciated that the n-well formation steps may also be used to form the n-type sinker wells 109, 111 for making ohmic contact with the buried layer 104. In forming the n-well region 110, the doping concentration, implant energy, and junction depth are selected and controlled so that the n-well region 110 is formed in the device drain area adjacent to the lightly doped p-well buffer region 106 so as to be substantially aligned with the drain-side edge of the subsequently-formed gate electrode 118, 119 (e.g., to within 10-15% of the width of the gate). As formed, the n-well region 110 defines a drift region for the NLDMOS structure 100. Though the n-well region 110 is depicted in FIG. 1 as being in ohmic and electrical contact with the buried layer 104, it will be appreciated that such a junction depth for the n-well region 110 is not necessarily required.

After forming the p-well and n-well regions, shallow trench isolation (STI) regions 112-117 may be formed in an upper portion of the substrate 150 to surround and isolate the various well regions and active areas in the NLDMOS structure 100. The STI regions 112-117 may be formed by selectively etching trench openings in the substrate 150 using an etch mask, filling the openings with appropriate isolation material(s), and then polishing or planarizing the isolation material(s) isolation down to the surface of the substrate 150. Though illustrated as STI regions, it will be appreciated that field oxide regions may also be used, or any other desired dielectric material which forms an electrical isolation barrier for electrically isolating the NLDMOS structure 100 from the rest of the integrated circuit. At this stage of the process sequence, STI regions 114, 115 in the drain area (e.g., over n-well region 110) are formed as a plurality of STI stripes to define dielectric RESURF (Dieler) drain extension structures as a plurality of narrow p-n diode structures in the n-well region 110 and adjacent lightly doped epitaxial p-type layers 106. FIG. 1 depicts a top substrate surface view 161 of the dielectric RESURF (Dieler) drain extension structure 161 formed at the drain of the gate electrode 118 using the plurality of STI stripes 114 to define narrow p-n diode structures from the n-well region 110 and epitaxial p-type layers 106. In similar fashion, the top substrate surface view 162 depicts the dielectric RESURF (Dieler) drain extension structure 162 formed at the drain of the gate electrode 119 using the plurality of STI stripes 115 to define narrow p-n diode structures from the n-well region 110 and epitaxial p-type layers 106. With this narrow p-n diode structure, there will be a wider depletion region (and therefore, higher breakdown voltage) than that of a normal diode without the STI side strips. In addition, the STI strips 114, 115 also contribute to doping dilution and additional fringe capacitance at the ends of the narrow p-n diode structures.

Over the substrate 150, a gate electrode structure is formed by sequentially forming a gate insulating layer and a conductive gate electrode layer between the source and drain regions, and then patterning and etching the layers to form the gate electrode structure 118, 119. While any desired materials may be used, a thin oxide or other dielectric layer may be used to form the gate insulating layer, and the conductive gate electrode may be formed using a conductive or semi-conductive material or combination thereof, such as a layer of one or more polysilicon and/or metal layers. As formed, the gate electrode structures 118, 119 are positioned to have a source-side edge that is adjacent to and substantially aligned with the gate-side edge of the p-well region 107, 108. The gate electrode structures 118, 119 are also positioned to have a drain-side edge that is adjacent to and substantially aligned with the gate-side edge of the n-well region 110. In addition, the gate electrode structures 118, 119 cover at least part of the exposed lightly doped p-well buffer region 106 to define a channel region to p-type high voltage well region 107 and at least part of the STI regions 114, 115 formed adjacent to the drain region 128. In accordance with the embodiments shown in FIG. 1, the gate electrode structures 118, 119 do not cover any exposed portion of the n-well drift region 110.

After forming the gate electrode structures 118, 119, one or more source extension or halo regions 120, 121 are formed to extend under the gate. For example, the halo regions 120, 121 may be formed by using an implant mask (not shown) in combination with the gate electrode structures 118, 119 to selectively implant n-type impurities into the substrate 150 in on the source-side of the gate electrode structures 118, 119 to a predetermined thickness (e.g., about 0.03-0.06 microns) using a predetermined implant energy and dopant concentration (e.g., 1E18-8E18 $cm^{-3}$, and more preferably approximately 5E18 $cm^{-3}$), though other dopant types, thicknesses, and/or concentrations may be used. As extension or halo regions, the doping concentration, implant energy, and junction depth are selected and controlled to form the halo regions 120, 121 so that they are shallower than the subsequently formed N+ source regions 127, 129 and so that they extend underneath the gate electrode structures 118, 119, taking into account the subsequent heat treatment steps.

After forming the halo regions 120, 121, a plurality of separate implant mask and implantation processes are used to form the contact region(s) 126, 130, source regions 127, 129, and drain regions 128, all the while protecting the halo regions 120, 121 and Dieler drain extension structures with silicide spacer implantation blocks 122-125 which may be formed using silicon nitride or silicon dioxide. In particular, a silicide layer is deposited over the substrate 150 and gate electrode structures 118, 119 and selectively etched to form a first and second silicide spacer implantation blocks 122, 125 on the source-side sidewalls of the gate electrode 118, 119 to protect the halo region 120, 121 from subsequent implantation. The selective etching also forms a third and fourth silicide spacer implantation block 123-124 on the Dieler drain extension structures 161, 162 formed at the drain of the gate electrode 118, 119 to protect against subsequent implantation.

With the silicide spacer implantation blocks 122-125 in place, the contact, source, and drain region 126-130 are formed of a material having second conductivity type impurities (e.g., N++ source region) in a predetermined upper region of the substrate 150. Yet another implant mask and implantation process are used to form the body contact regions 131-132 in the p-well region 107, 108 with material having first conductivity type impurities (e.g., P++ body contact region) so as to be adjacent to the source regions 127, 129, respectively. The body contact region 131 is the "back gate" or "body" region that is shorted to the first source region 127 to improve device robustness. There is also a P++ body contact region 132 formed adjacent to the source region 129 in the p-well region 108. Though the body, the source, and the drain regions can be formed using photoresist implant masks to selectively diffuse or implant the appropriate impurities into the n-well and p-well areas, it will be appreciated that other masking or selective diffusion or implantation techniques may also be used so that these regions are all heavily doped in order to allow for good ohmic contact, and thus may be called ohmic regions on which metal contacts (not shown) may be formed. During back-end processing, one or more source metallization layer(s) 140 and gate metallization layer(s) 141 are formed to connect the source and gate to source and gate voltages, respectively. In addition, the drain and contact regions are shorted together to a common drain voltage using one or more connecting metallization layer(s) 142.

With the configuration, a NLDMOS transistor includes a P− substrate 150 with an n-type low voltage well/layer 110 (in which the N+ drain 128 is formed), a lightly doped p-well buffer region 106 (formed adjacent the n-well region 110), and a p-type low voltage well/layer 107 (formed within the p-well buffer region 106 to be pulled back from the n-well region 110 for containing the N+ source and body contact regions 127, 131). The N+ drain region 128 and n-well 110 together form the drain of the device which, along with the p-well buffer region 106 and N+ buried layer 104, creates the desired RESURF action. In addition, the depicted p-well buffer region 106 forms the body of NLDMOSFET in which the gate channel region is formed having a surface concentration that sets the threshold voltage for the device. The positioning of the p-well buffer region 106 also functions to increase the device breakdown voltage by effectively pulling back the more heavily doped p-well region 107 from the n-well region 110. With the p-well region 107 pulled back, the depth of the n-well region 110 can be larger than the depth of the STI regions 114 without suffering partial depletion and much lower breakdown voltage performance that would result if the p-well and n-well regions were directly adjacent one another. A gate electrode 118 is formed over the exposed portion of the p-well buffer region 106 between the p-well 107 and n-well region 110, and in the substrate 150, a source extension or halo region 120 is formed to extend under the gate electrode 118 to help prevent punch through. Across the n-well/layer 110 and p-well buffer region 106, the STI regions 114 define the Dieler drain extension structures 161 at the drain of the gate electrode 118, thereby providing a partially depleted n-drift region at the surface of the n-well 110 due to the wider depletion regions created by the STI strips 114. The combination of the source extension halo region 120, the p-well region 107 aligned with the gate edge, the very lightly doped p-epi buffer region 106 providing a channel and drain junction buffer, and the STI/active stripe geometry 106/114/110 with the heavily doped n-well drift region 110 can increase break down voltage and prevent punch through, provide better HCI immunity in surface channel, and provide better conductivity for lower device Rdson.

As shown in FIG. 1, the layout and positioning of the Dieler drain extension structures may be exploited to form a plurality of NLDMOS structures with shared drain regions. In particular, FIG. 1 depicts a second NLDMOS transistor which includes an n-type low voltage well/layer 110 (with shared N+ drain 128 formed therein), a lightly doped p-well buffer region 106 (formed adjacent the n-well region 110), and a p-type low voltage well/layer 108 (formed within the p-well buffer region 106 to be pulled back from the n-well region 110 for containing the N+ source and body contact regions 129, 132). A gate electrode 119 is formed over the exposed portion of the p-well buffer region 106 between the p-well 108 and n-well region 110, and a source extension or halo region 121 formed in the substrate 150 extends under the gate electrode 119. STI regions 115 formed across the n-well/layer 110 and p-well buffer region 106 define the Dieler drain extension structures 162 at the drain of the gate electrode 119 to provide a partially depleted n-drift region at the surface of the n-well 110 due to the wider depletion regions created by the STI strips 115. The combination of the source extension halo region 121, the p-well region 108 aligned with the gate edge, the very lightly doped p-epi buffer region 106 providing a channel and drain junction buffer, and the STI/active stripe geometry 106/115/110 with the heavily doped n-well drift region 110 can increase break down voltage and prevent punch through, provide better HCI immunity in surface channel, and provide better conductivity for lower device Rdson.

Even though the n-well region 110 is deeper than the striped STI regions 114, 115, it will be appreciated that existing low voltage CMOS processes can be used to fabricate the partially depleted Dieler NLDMOS structure 100 since the positioning of the lightly doped p-well buffer region 106 and the STI/active stripe geometry 106/114/110 effectively increases the breakdown voltage and provides better conductivity for lower device Rdson, notwithstanding the fact that the n-well is deeper than the STI regions 114/115. With the disclosed dielectric RESURF NLDMOS structure, high voltage MOSFET transistors can be built with low voltage CMOS technologies without requiring additional device area or processing costs (e.g., additional high voltage n/p wells, thick gate oxides, extra thermal budget, etc.). However, it will be appreciated that selected embodiments of the present invention may also be implemented with high voltage processes when available to further improve breakdown voltage and Rdson performance.

Figure 2:
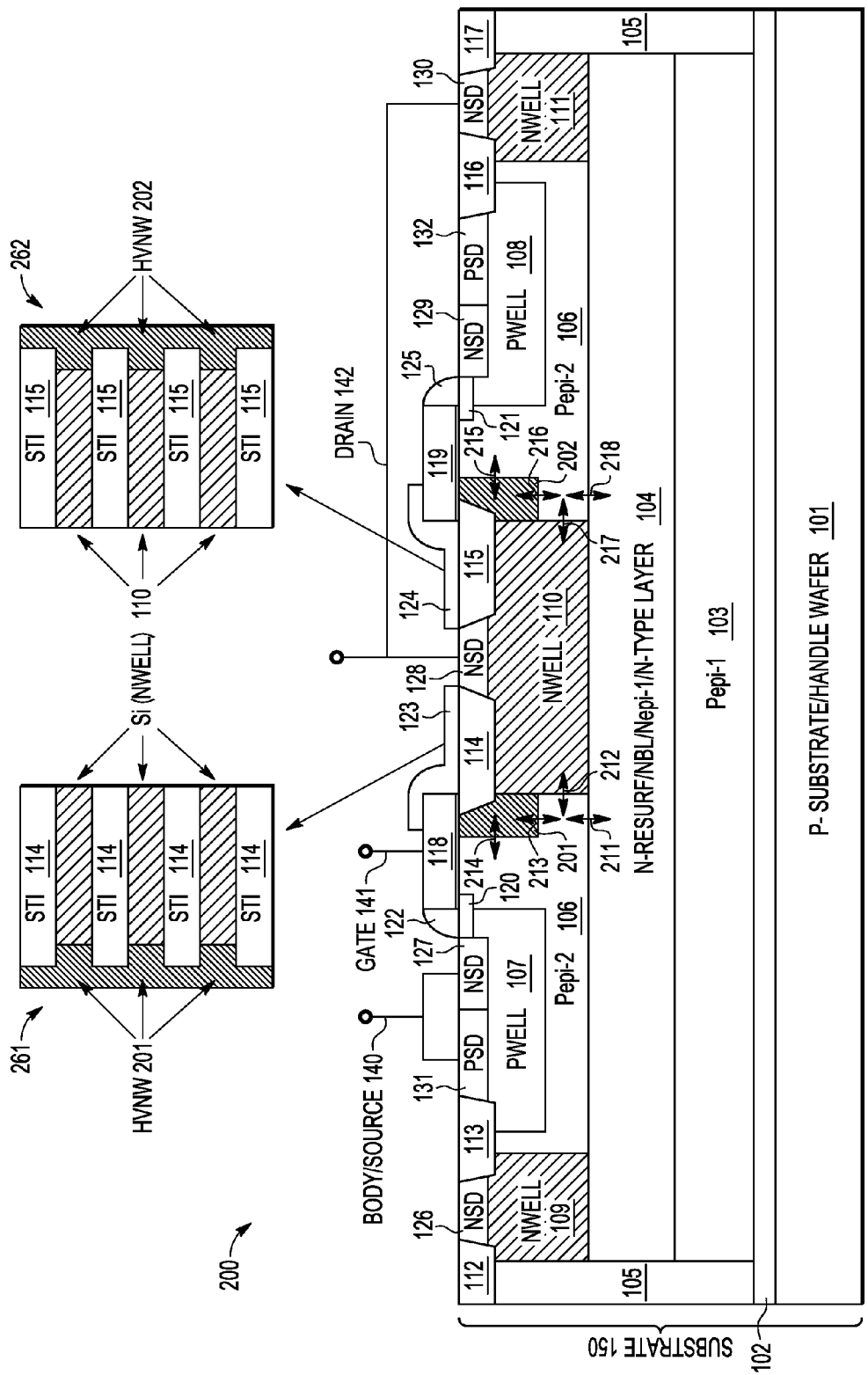
FIG. 2 is a partial cross-sectional view of an LDMOS device having a dielectric RESURF drain extension structure using a lightly doped p-well buffer region, gate halo region, and lightly doped high voltage n-well buffer region in accordance with selected embodiments of the present invention.

To provide an example illustration of a high voltage CMOS process may be used to fabricate a partially depleted Dieler NLDMOS in accordance with selected embodiments of the present invention, reference is now made to FIG. 2 which depicts an LDMOS device 200 having dielectric RESURF drain extension structure(s) 261, 262 using a lightly doped p-well buffer region 106, gate halo region 120, 121, and lightly doped high voltage n-well buffer region(s) 201, 202 formed adjacent to the n-well region 110. Again, the depicted structures, well, and layer regions are illustrated in simplified form with straight lines and corner regions, but the actual profile(s) for the different structures, well, and layer regions will depend on the specific fabrication process(es) used. Also, to the extent that the device layers, regions, and features in FIGS. 1 and 2 correspond to one another, the same reference numerals have been used so that the description need not be repeated here.

The depicted LDMOS device 200 includes an additional drift region feature 201, 202 that may be formed with a high voltage fabrication process. In particular and as shown in FIG. 2, one or more lightly doped high voltage well regions 201, 202 are formed to a predetermined depth of a material having the second conductivity type (e.g., n-type) impurities so as to be located adjacent to the n-well region 100 and beneath the gate electrode 118, 110. As will be appreciated, the lightly doped high voltage n-well (HVNW) 201, 202 may be formed by using an implant mask or other technique to selectively diffuse or implant p-type impurities to a predetermined implant energy and dopant concentration (e.g., 1E14 to 1E16 cm$^{-3}$, and more preferably approximately 5E15 cm$^{-3}$), though other dopant types, thicknesses, and/or concentrations may be used. It will also be appreciated that the HVNW 201, 202 are formed in the substrate 150 as one of the well formation steps (e.g., before or after forming the n-well region 110) that is performed before forming the STI regions 114, 115 and gate electrodes 118, 119. However formed, the doping concentration, implant energy, and junction depth are selected and controlled to form the HVNW 201, 202 so that they are adjacent to the n-well region 110 and extend partially underneath the gate electrode 118, 119, thereby providing a buffer function between the more heavily doped n-well and p-well regions 110, 107/108. In addition, the formation and placement of the HVNW 201, 202 (including any subsequent heat treatment steps) may be controlled so that the depth of the HVNW 201, 202 is less than the depth of the n-well region 110.

With the HVNW regions 201, 202 formed, each individual LDMOS device includes four PN junctions at the transition from the drain to the channel. This is shown with the LDMOS device on the left of FIG. 2 which includes a first, horizontal PN junction 211 between the N+ buried layer 104 and the Pepi-2 buffer region 106; a second, vertical PN junction 212 between the Pepi-2 buffer region 106 and the N-well region 110; a third, horizontal PN junction 213 between the Pepi-2 buffer region 106 and the HVNW region 201; and a fourth, vertical PN junction 214 between the Pepi-2 buffer region 106 and the HVNW region 201. Likewise, the LDMOS device on the right of FIG. 2 includes a first, horizontal PN junction 218 between the N+ buried layer 104 and the Pepi-2 buffer region 106; a second, vertical PN junction 217 between the Pepi-2 buffer region 106 and the N-well region 110; a third, horizontal PN junction 216 between the Pepi-2 buffer region 106 and the HVNW region 202; and a fourth, vertical PN junction 215 between the Pepi-2 buffer region 106 and the HVNW region 202. While each of the PN junctions 211-214, 215-218 contribute to the breakdown voltage performance, it will be appreciated that the vertical junctions 212, 217 below the HVNW regions 201, 202 contribute primarily to the RESURF action.

By forming the HVNW regions 201, 202 prior to forming the STI regions, the STI regions 114, 115 in the drain area (e.g., over n-well region 110) define dielectric RESURF (Dieler) drain extension structures 261, 262 as a plurality of PN junction diode structures 211-214, 215-218. As illustrated in FIG. 2 with the top substrate surface view 261 of the dielectric RESURF (Dieler) drain extension structure formed at the drain of the gate electrode 118, the plurality of STI stripes 114 define the RESURF drain extended drift region which starts to deplete from the top PN junction 214 (between the Pepi-2 layer 106 and HVNW region 201) into the heavier N-well region 110 in-between STI strips to support the breakdown voltage in the horizontal direction. In similar fashion, the top substrate surface view 262 depicts the dielectric RESURF (Dieler) drain extension structure formed at the drain of the gate electrode 119, where the plurality of STI stripes 115 define the RESURF drain extended drift region which starts to deplete from the top PN junction 215 (between the Pepi-2 layer 106 and HVNW region 202) into the heavier N-well region 110 in-between STI strips to support the breakdown voltage in the horizontal direction. With this drain extension structure, there will be a wider depletion region (and therefore, higher breakdown voltage) due to the action of the PN junctions 211-214, 215-218. And by positioning the lightly doped HVNW region 201, 202 adjacent to the more heavily doped n-well region 110 and under the gate electrode, the device breakdown voltage is increased as compared to the situation where the n-well 110 and p-well regions 107, 108 are positioned adjacent to one another.

Figure 3:
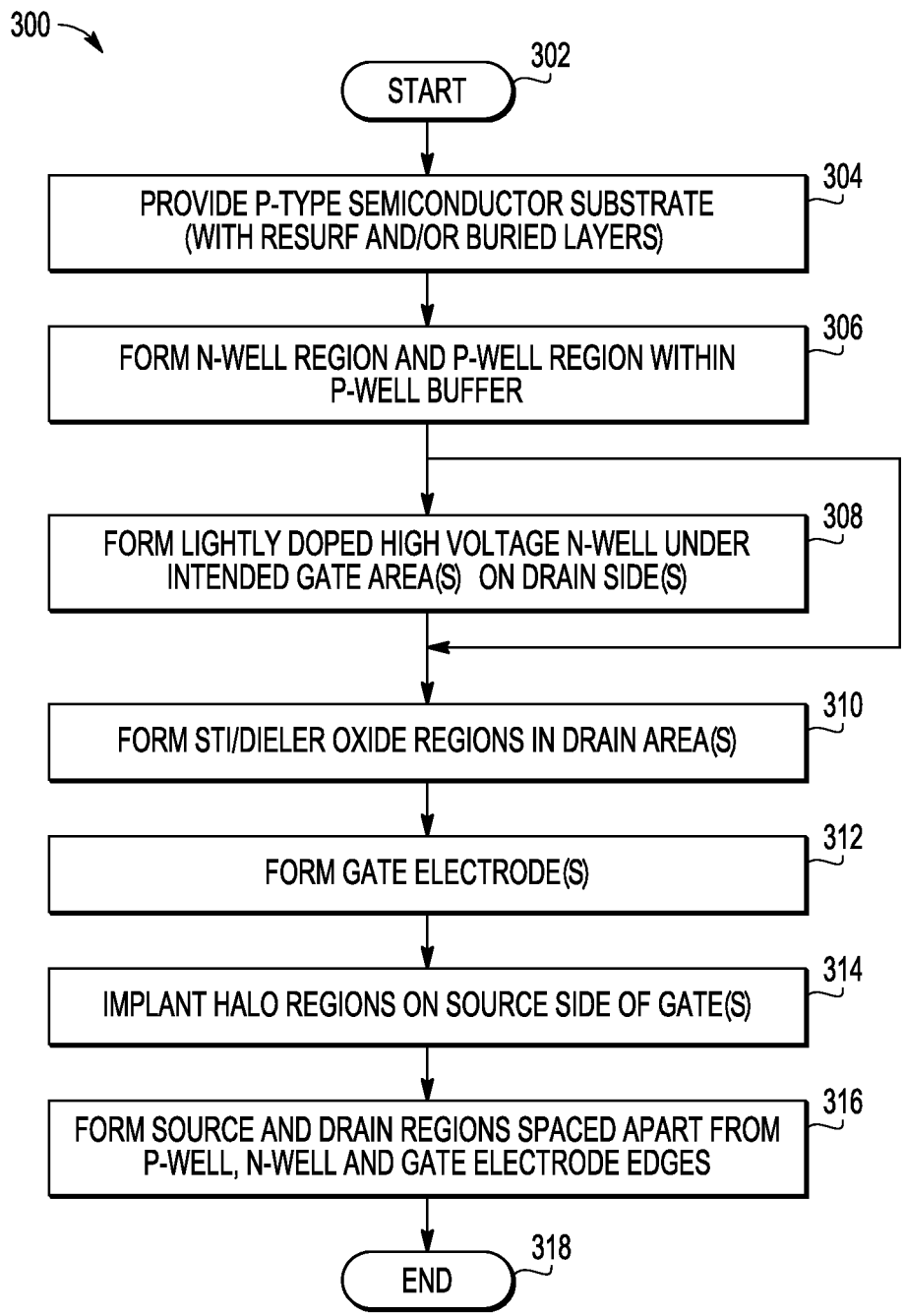
FIG. 3 is a simplified schematic flow chart illustrating various methods for fabricating devices in accordance with selected embodiments of the invention.

FIG. 3 is a simplified schematic flow chart illustrating a method 300 for fabricating devices of the type illustrated in FIGS. 1-2 in accordance with selected embodiments of the invention. In describing the fabrication methodology 300, various reference numbers, doping types and concentrations are provided by way of examples of different regions that can be formed, but this is intended merely to facilitate understanding of various exemplary embodiments and not by way of limitation. Once the fabrication methodology starts (step 302), a semiconductor substrate layer is provided at step 304 which has a first conductivity type (e.g., p-type) and doping concentration (e.g., approximately 2E15 cm$^{-3}$). Unless otherwise indicated, subsequent steps may be provided in any desired order. In the semiconductor substrate layer, one or more RESURF and/or buried layers may be formed (step 304). In addition or in the alternative, n-well and p-well regions are selectively formed in the substrate (step 306). In particular, an n-well drift region may be formed by selectively implanting and diffusing a dopant having a second conductivity type (e.g., n-type) at a predetermined total integrated doping (e.g., approximately 5E16 to 5E17 cm$^{-2}$) into an area which will contain the drain region. In addition, a heavily doped p-well region for containing the source region may be formed within a lightly doped p-well buffer region by selectively implanting and diffusing a dopant having the first conductivity type (e.g., p-type) at a predetermined total integrated doping (e.g., approximately 5E16 to 5E18 cm$^{-2}$) into a lower doped well buffer region having the first conductivity type (e.g., approximately 1E14 to 1E16 cm$^{-3}$, and more preferably 2E15 cm$^{-3}$). As formed, the p-well buffer region defines the channel region and separates the n-well and p-well regions.

When a high voltage fabrication process is available, the channel region may further be defined at step 308 to include a lightly doped high voltage well region having the second conductivity type (e.g., n-type) at a predetermined total integrated doping (e.g., approximately 1E14 to 1E16 cm$^{-2}$) that is formed adjacent to the n-well region and under the intended gate area. The optional nature of step 308 as depending on the availability of the high voltage fabrication process is indicated by the line around step 308.

At step 310, shallow trench isolation (STI) regions are formed in the substrate 150 to define dielectric RESURF (Dieler) drain extension structures in the intended drain area. In some embodiments, the STI regions are formed across the n-well and adjacent p-well buffer regions to define a plurality of narrow p-n diode structures which create relatively wide depletion regions (and therefore, higher breakdown voltage). In other embodiments, the STI regions are formed across the n-well and an adjacent lightly doped high voltage n-well region (when the processing step 308 is performed) to define a drain extension structures with a plurality of PN junction diode structures which create relatively wide depletion regions (and therefore, higher breakdown voltage). As formed, the STI regions are shallower than the n-well drift region, but any deleterious effects are compensative for by using the lightly doped p-well buffer to separate the more heavily doped n-well and p-well from one another.

After forming a gate dielectric layer, a control or gate electrode may be formed (step 312) to overlie part of the lightly doped p-well buffer region P-body region (and any adjacent lightly doped high voltage n-well region) so that the gate electrode aligns with the gate-side edge of the p-well region and the gate-side edge of the n-well region. At step 314, halo regions are implanted around the source-side edge of the gate electrode so that they can subsequently be heat driven to overlap with the gate electrode edge. In addition, sidewall spacers and/or implant masks are used to form source and drain regions (step 316) proximate to the upper surface of the substrate, such as by implanting impurities of a second conductivity type (e.g., N-type) at a predetermined doping concentration (e.g., N++). As formed, the source and drain regions are located to be completely contained within the p-well and n-well regions, respectively, so that they are spaced apart from the edges of the p-well, n-well, and gate electrode. In addition, a source contact region may be formed adjacent to the source region with a material of the first conductivity type (e.g., P-type) at a predetermined doping concentration (e.g., P++). As depicted, the fabrication methodology 300 ends at step 318.

By now it should be appreciated that there is provided herein a laterally diffused MOS semiconductor device and method for fabricating same. The disclosed semiconductor device is formed over a semiconductor substrate of a first conductivity type (e.g., p-type), and includes first heavily doped semiconductor region of the first conductivity type (e.g., p-type well formed at the surface of the substrate) which is formed in the substrate to surround a first source region of a second, different conductivity type (e.g., N+ source) formed in a predetermined upper region of the first heavily doped semiconductor region. Also included is a second heavily doped semiconductor drift region of the second conductivity type (e.g., n-type well) formed at the surface of the substrate to surround the drain region and to be spaced apart from the first heavily doped semiconductor region to define a channel region therebetween. A drain region of the second conductivity type is formed in a predetermined upper region of the second heavily doped semiconductor region to be spaced a predetermined distance from the first heavily doped semiconductor region. In addition, a third lightly doped semiconductor region of the first conductivity type (e.g., p-type epitaxial layer grown from the substrate) is formed in the substrate to surround the first heavily doped semiconductor region, thereby separating the first heavily doped semiconductor region from the second heavily doped semiconductor region to form at least part of the channel region. A gate electrode and a gate insulating layer are formed over the channel region such that the gate electrode has a source-side edge that is substantially aligned with a gate-side edge of the first heavily doped semiconductor region and a drain-side edge that is substantially aligned with a gate-side edge of the second heavily doped semiconductor region. Extending under the gate electrode is a lightly doped source extension region (e.g., n-type halo or pocket region) which extends from the first source region and first heavily doped semiconductor region and into the third lightly doped semiconductor region. A plurality of insulator strips are formed at a surface of the substrate to define one or more p-n diode structures in at least the second heavily doped semiconductor drift region between the first drain region and gate electrode area. In selected embodiments, the plurality of insulator strips are implemented with shallow trench isolation strips formed to a depth that is shallower than the second heavily doped semiconductor drift region, thereby defining a plurality of narrow p-n diode structures over the third lightly doped semiconductor region and the second heavily doped semiconductor drift region between the first drain region and gate electrode area. In other embodiments, a fourth lightly doped high voltage semiconductor region of the second conductivity type (e.g., lightly doped n-type high voltage n-well buffer) is formed in the substrate adjacent to the second heavily doped semiconductor drift region, thereby separating the first heavily doped semiconductor region from the second heavily doped semiconductor region to form at least part of the channel region. In these embodiments, the insulator strips may be implemented with shallow trench isolation strips formed to define one or more p-n diode structures in the second heavily doped semiconductor drift region, the fourth lightly doped high voltage semiconductor region and the third lightly doped semiconductor region.

In another form, there is provided a method of fabricating a semiconductor device. In the disclosed methodology, a first lightly doped substrate region of a first conductivity type (e.g., p-type) is formed in a semiconductor substrate. A first doped well of the first conductivity type is formed within the first lightly doped substrate region so that the first doped well has a first lateral edge extending to a surface of the semiconductor substrate. In a designated source region area of the first doped well, a source region of a second, opposite, conductivity type (e.g., n-type) is formed. There is also formed in the semiconductor substrate a second doped well of the second conductivity type (e.g., a heavily doped epitaxial n-type drift region) having a second lateral edge extending to a surface of the semiconductor substrate and spaced apart from the first lateral edge, where second doped well is disposed adjacent to the first lightly doped substrate region to surround a designated drain region area, thereby forming a PN junction with first lightly doped substrate region at the surface of the semiconductor substrate. In the designated drain region area of the second doped well, a first drain region of the second conductivity type is formed. In addition, a plurality of insulator strips are formed at the surface of the semiconductor substrate to define one or more diode structures across the PN junction that extend between the first drain region and a designated gate electrode region. In selected embodiments, the insulator strips are formed as shallow trench isolation strips to a depth that is shallower than the second doped well. Thereafter, a gate electrode is formed overlying the surface of the semiconductor substrate at the designated gate electrode region. As formed, a first side edge of the gate electrode is substantially aligned with the first lateral edge of the first doped well, and a second opposite side edge of the gate electrode is substantially aligned with the second lateral edge of the second doped well. Lightly doped source extension region(s) may also be formed to extend under the first side edge of the gate electrode from the first source region and first doped well and into the first lightly doped substrate region, such as by implanting an impurity ion into the substrate using the gate electrode as an implantation mask to form a halo implant region in substantial self alignment with the gate electrode, and then heat driving the halo implant region into the semiconductor substrate to extend under the first side edge of the gate electrode.

In yet another form, there is provided a method forming an LDMOS device. In the disclosed methodology, a semiconductor substrate is provided having a first lightly doped p-type region extending to a surface of the semiconductor region in at least a first channel region. First and second wells are formed in the semiconductor substrate spaced apart by at least the first lightly doped p-type region, where the first well is a p-type well for containing a source region and having a first lateral edge extending to a surface of the semiconductor substrate, and where the second well is an n-well for containing a drain region and having a first lateral edge extending to the surface of the semiconductor substrate. In addition, a lightly doped n-well is formed in the semiconductor substrate adjacent to the second well and spaced apart from the first well by at least the first lightly doped p-type region so that the lightly doped n-well and first lightly doped p-type region separate the first and second wells to form at least part of the first channel region. The lightly doped n-well may be formed by implanting a lightly doped n-type high voltage n-well buffer region. A plurality of insulator strips are formed in an upper surface region of at least the second well to define a plurality of narrow diode structures that extend from a designated drain region area to a designated gate electrode region area. For example, the insulator strips may be formed as a plurality of shallow trench isolation regions to a depth that is shallower than the second well. In addition, a gate electrode is formed that is insulated from the surface and that overlies first lightly doped p-type region. As formed, the gate electrode has a first side edge substantially aligned with the first lateral edge and a second side edge substantially aligned with the second lateral edge. The gate electrode is used as at least a partial mask for implanting impurities into the semiconductor substrate to form a lightly doped n-type source extension region which overlaps with the first side edge of the gate electrode. Subsequently, n-type source and drain regions are implanted into the first and second wells, respectively, so that the source region is located within the first well to be spaced apart from the first lateral edge, and the drain region is located in the second well to be spaced apart from the second lateral edge.

Although the described exemplary embodiments disclosed herein are directed to various partially depleted Dieler LDMOS transistors and methods for making same, the present invention is not necessarily limited to the example embodiments which illustrate inventive aspects of the present invention that are applicable to a wide variety of transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are for N-channel LDMOS transistor devices or the like, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conduction type. Moreover, the thicknesses and doping concentrations of the described layers may deviate from the disclosed ranges or values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
   a first heavily doped semiconductor region of a first conductivity type located in a substrate;
   a first source region of a second conductivity type different from the first conductivity type that is located in a predetermined upper region of the first heavily doped semiconductor region;
   a second heavily doped semiconductor drift region of the second conductivity type formed in the substrate to be spaced apart from the first heavily doped semiconductor region;
   a first drain region of the second conductivity type formed in a predetermined upper region of the second heavily doped semiconductor drift region, the first drain region being spaced a predetermined distance from the first heavily doped semiconductor region;
   a third lightly doped semiconductor region of the first conductivity type formed in the substrate to surround the first heavily doped semiconductor region, thereby separating the first heavily doped semiconductor region from the second heavily doped semiconductor drift region to form at least part of a channel region;
   a gate electrode and a gate insulating layer formed over the channel region; and
   a plurality of insulator strips formed at a surface of the substrate to define one or more drain extension structures in at least the second heavily doped semiconductor drift region between the first drain region and gate electrode.

2. The semiconductor device of claim 1, where the first conductivity type is p-type, and the second conductivity type is n-type.

3. The semiconductor device of claim 1, wherein the first heavily doped semiconductor region comprises a p-type well located at the surface of the substrate.

4. The semiconductor device of claim 1, wherein the second heavily doped semiconductor drift region comprises an n-type well located at the surface of the substrate.

5. The semiconductor device of claim 1, where the third lightly doped semiconductor region comprises a p-type epitaxial layer in which the first heavily doped semiconductor region and second heavily doped semiconductor drift region are formed.

6. The semiconductor device of claim 1, where the plurality of insulator strips comprises a plurality of shallow trench isolation strips formed to a depth that is shallower than the second heavily doped semiconductor drift region.

7. The device of claim 6, where the one or more drain extension structures comprise one or more narrow p-n diode structures, each having a diode junction between the third lightly doped semiconductor region and the second heavily doped semiconductor drift region.

8. The semiconductor device of claim 1, further comprising a fourth lightly doped high voltage semiconductor region of the second conductivity type located in the third lightly doped semiconductor region and adjacent to the second heavily doped semiconductor drift region and to a depth that is shallower than the second heavily doped semiconductor drift region, thereby separating a portion of the third lightly doped semiconductor region at a surface of the substrate from the second heavily doped semiconductor drift region to form at least part of the channel region.

9. The semiconductor device of claim 8, where the fourth lightly doped high voltage semiconductor region comprises a lightly doped n-type high voltage n-well buffer.

10. The device of claim 9, where the plurality of insulator strips comprises a plurality of shallow trench isolation strips formed to define one or more drain extension structures in the second heavily doped semiconductor drift region and the fourth lightly doped high voltage semiconductor region.

11. A method of fabricating a semiconductor device, comprising in any order:
forming a first doped well of a first conductivity type within a first lightly doped region, where the first doped well is disposed to surround a designated source region area and has a first lateral edge extending to a surface of a semiconductor substrate;
forming in the designated source region area of the first doped well a first source region of a second, opposite, conductivity type;
forming in the semiconductor substrate a second doped well of the second conductivity type having a second lateral edge extending to a surface of the semiconductor substrate and spaced apart from the first lateral edge, where second doped well is disposed to surround a designated drain region area, thereby forming a PN junction with first lightly doped substrate region at the surface of the semiconductor substrate;
forming in the designated drain region area of the second doped well a first drain region of the second conductivity type;
forming a plurality of insulator strips at the surface of the semiconductor substrate to define one or more narrow diode structures across the PN junction that extend between the first drain region and a designated gate electrode region; and
forming a gate electrode overlying the surface of the semiconductor substrate at the designated gate electrode region.

12. The method of claim 11, where the first conductivity type is p-type, and the second conductivity type is n-type.

13. The method of claim 11, further comprising implanting a lightly doped source extension region which extends under the first side edge of the gate electrode from the first source region and first doped well and into the first lightly doped substrate region.

14. The method of claim 11, where forming the gate electrode comprises forming a gate electrode overlying the surface of the semiconductor substrate at the designated gate electrode region, wherein a first side edge of the gate electrode is substantially aligned with the first lateral edge of the first doped well, and a second opposite side edge of the gate electrode is substantially aligned with the second lateral edge of the second doped well.

15. The method of claim 11, where forming the plurality of insulator strips comprises forming a plurality of shallow trench isolation strips to a depth that is shallower than the second doped well.

16. The method of claim 11, where forming the second doped well comprises forming a heavily doped epitaxial n-type drift region located at the surface of the semiconductor substrate to surround the first drain region.

17. A method for forming an LDMOS device, comprising:
providing a semiconductor substrate having a first lightly doped p-type region extending to a surface of the semiconductor region in at least a first channel region;
forming first and second wells in the semiconductor substrate spaced apart by at least the first lightly doped p-type region, where the first well is a p-type well for containing a source region and having a first lateral edge extending to a surface of the semiconductor substrate, and where the second well is an n-well for containing a drain region and having a second lateral edge extending to the surface of the semiconductor substrate;
forming a plurality of insulator strips in an upper surface region of at least the second well to define one or more drain extension structures that extend from a designated drain region area to a designated gate electrode region area;
forming a gate electrode insulated from the surface overlying the first lightly doped p-type region;
using the gate electrode as at least a partial mask, implanting impurities into the semiconductor substrate to form a lightly doped n-type source extension region which overlaps with the first side edge of the gate electrode; and
implanting n-type source and drain regions into the first and second wells, respectively, so that the source region is located within the first well to be spaced apart from the first lateral edge, and the drain region is located in the second well to be spaced apart from the second lateral edge.

18. The method of claim 17, where forming the forming a plurality of insulator strips comprises forming a plurality of shallow trench isolation regions to a depth that is shallower than the second well.

19. The method of claim 17, further comprising forming a lightly doped n-well in the semiconductor substrate adjacent to the second well and spaced apart from the first well by at least the first lightly doped p-type region so that the lightly doped n-well and first lightly doped p-type region separate the first and second wells to form at least part of the first channel region.

20. The method of claim 19, where forming the lightly doped n-well comprises implanting a lightly doped n-type high voltage n-well buffer region.

* * * * *